US012660562B2

(12) United States Patent
Maki

(10) Patent No.: US 12,660,562 B2
(45) Date of Patent: Jun. 16, 2026

(54) DETECTION SYSTEM, DETECTION METHOD, AND STORAGE MEDIUM

(71) Applicant: Tokyo Electron Limited, Tokyo (JP)

(72) Inventor: Junnosuke Maki, Koshi City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 610 days.

(21) Appl. No.: 18/077,470

(22) Filed: Dec. 8, 2022

(65) Prior Publication Data

US 2023/0187247 A1      Jun. 15, 2023

(30) Foreign Application Priority Data

Dec. 15, 2021      (JP) ................................. 2021-203264

(51) Int. Cl.
H10P 72/30          (2026.01)
H10P 72/00          (2026.01)
(Continued)

(52) U.S. Cl.
CPC ...... H10P 72/3411 (2026.01); H10P 72/0451 (2026.01); H10P 72/0606 (2026.01);
(Continued)

(58) Field of Classification Search
CPC ......... H01L 21/67778; H01L 21/67265; H01L 21/67742; H01L 21/68707;
(Continued)

(56) References Cited

U.S. PATENT DOCUMENTS

| | | | | |
|---|---|---|---|---|
| 4,856,301 A | * | 8/1989 | Broadbent | .............. D06F 33/48 |
| | | | | 68/12.23 |
| 2004/0079154 A1 | * | 4/2004 | Yoshikawa | ........... G01P 15/125 |
| | | | | 73/514.32 |

(Continued)

FOREIGN PATENT DOCUMENTS

| | | | |
|---|---|---|---|
| JP | 2000-012417 A | | 1/2000 |
| JP | 2003243479 A | * | 8/2003 |

(Continued)

OTHER PUBLICATIONS

WO-2012080094-A1 (Year: 2012).*
JP-2003243479-A (Year: 2003).*

*Primary Examiner* — Ernesto A Suarez
*Assistant Examiner* — Laurence R Brothers
(74) *Attorney, Agent, or Firm* — Nath, Goldberg & Meyer; Jerald L. Meyer; Tanya E. Harkins

(57) ABSTRACT

A detection system configured to detect a state of a structure within a processing space of a substrate processing apparatus, includes: a detection substrate including a state detector that detects the state of the structure; a transfer device that loads and unloads each of a substrate to be processed and the detection substrate into and from the processing space; and a control device, wherein the detection substrate further includes at least one acceleration detector that detects an acceleration in each of two directions intersecting each other in a surface of the substrate, and wherein the control device estimates an orientation of the state detector on the detection substrate within the processing space based on a detection result obtained by the at least one acceleration detector when the detection substrate is moved in a loading/unloading direction during loading or unloading of the detection substrate into or from the processing space.

16 Claims, 12 Drawing Sheets

(51) Int. Cl.
      *H10P 72/50*       (2026.01)
      *H10P 72/76*       (2026.01)

(52) U.S. Cl.
      CPC .......... *H10P 72/0608* (2026.01); *H10P 72/30* (2026.01); *H10P 72/3302* (2026.01); *H10P 72/3402* (2026.01); *H10P 72/50* (2026.01); *H10P 72/7602* (2026.01)

(58) Field of Classification Search
      CPC ............ H01L 21/67259; H01L 21/677; H01L 21/67155; H01L 21/67766; H01L 21/6715; H01L 21/67253; H01L 21/68
      See application file for complete search history.

(56)             References Cited

U.S. PATENT DOCUMENTS

| | | | |
|---|---|---|---|
| 2010/0055312 A1 * | 3/2010 | Kato ................. | C23C 16/45508 |
| | | | 118/668 |
| 2013/0074326 A1 * | 3/2013 | Uekawa ................ | H01L 21/677 |
| | | | 414/222.01 |
| 2013/0081655 A1 * | 4/2013 | Mendiratta ....... | H01L 21/02065 |
| | | | 134/57 R |
| 2015/0176980 A1 * | 6/2015 | Jensen .................. | H01L 21/681 |
| | | | 356/244 |
| 2016/0282112 A1 * | 9/2016 | Scheiermann ........... | G01D 1/16 |

FOREIGN PATENT DOCUMENTS

| | | | | |
|---|---|---|---|---|
| JP | 2016-146416 A | 8/2016 | | |
| JP | 2017-504014 A | 2/2017 | | |
| WO | WO-2012080094 A1 * | 6/2012 | ........... | G06F 3/0433 |

* cited by examiner

FIG. 11

| X-axis | Y-axis | Orientation |
|--------|--------|-------------|
| A>B | A≒B | 0deg |
| A>B | A<B | 45deg |
| A≒B | A<B | 90deg |
| A<B | A<B | 135deg |
| A<B | A≒B | 180deg |
| A<B | A>B | 225deg |
| A≒B | A>B | 270deg |
| A>B | A>B | 315deg |
| A≒B | A≒B | Undefined(error) |

DETECTION SYSTEM, DETECTION METHOD, AND STORAGE MEDIUM

CROSS-REFERENCE TO RELATED APPLICATION

This application is based upon and claims the benefit of priority from Japanese Patent Application No. 2021-203264, filed on Dec. 15, 2021, the entire contents of which are incorporated herein by reference.

TECHNICAL FIELD

The present disclosure relates to a detection system, a detection method, and a non-transitory computer-readable storage medium.

BACKGROUND

An apparatus disclosed in Patent Document 1 holds a predetermined jig, instead of a substrate, on a transfer arm of a substrate transfer robot. In this state, a nozzle is moved to a discharge position, and the nozzle and the jig are brought into close in proximity until they have a predetermined relative positional relationship. Then, in that proximity state, as the substrate transfer robot is operated in the X direction and the Y direction, the jig moves in the X direction and the Y direction. With this movement, since there is a position where light from a light emitter attached to the jig is blocked by the nozzle, calculation is performed based on an output obtained from a light receiver attached to the jig to specify the nozzle position.

PRIOR ART DOCUMENT

Patent Document

Patent Document 1: Japanese Laid-Open Publication No. 2000-012417

SUMMARY

According to one embodiment of the present disclosure, there is provided a detection system provided with a substrate processing apparatus that processes a substrate and configured to detect a state of a structure within a processing space of the substrate processing apparatus, including: a detection substrate including a state detector configured to detect the state of the structure; a transfer device configured to load and unload each of a substrate to be processed and the detection substrate into and from the processing space of the substrate processing apparatus; and a control device, wherein the detection substrate further includes at least one acceleration detector configured to detect an acceleration in each of two directions intersecting each other in a surface of the substrate, and wherein the control device estimates an orientation of the state detector on the detection substrate within the processing space based on a detection result obtained by the at least one acceleration detector when the detection substrate is moved in a loading/unloading direction during loading or unloading of the detection substrate into or from the processing space.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 11 is a diagram illustrating an example of a table used for estimating the orientation of the camera within the processing space.

FIGS. 12A and 12B are diagrams illustrating examples of a positional relationship between a solvent discharge nozzle and the detection wafer during detection of the height of the solvent discharge nozzle.

DETAILED DESCRIPTION

Figure 1:
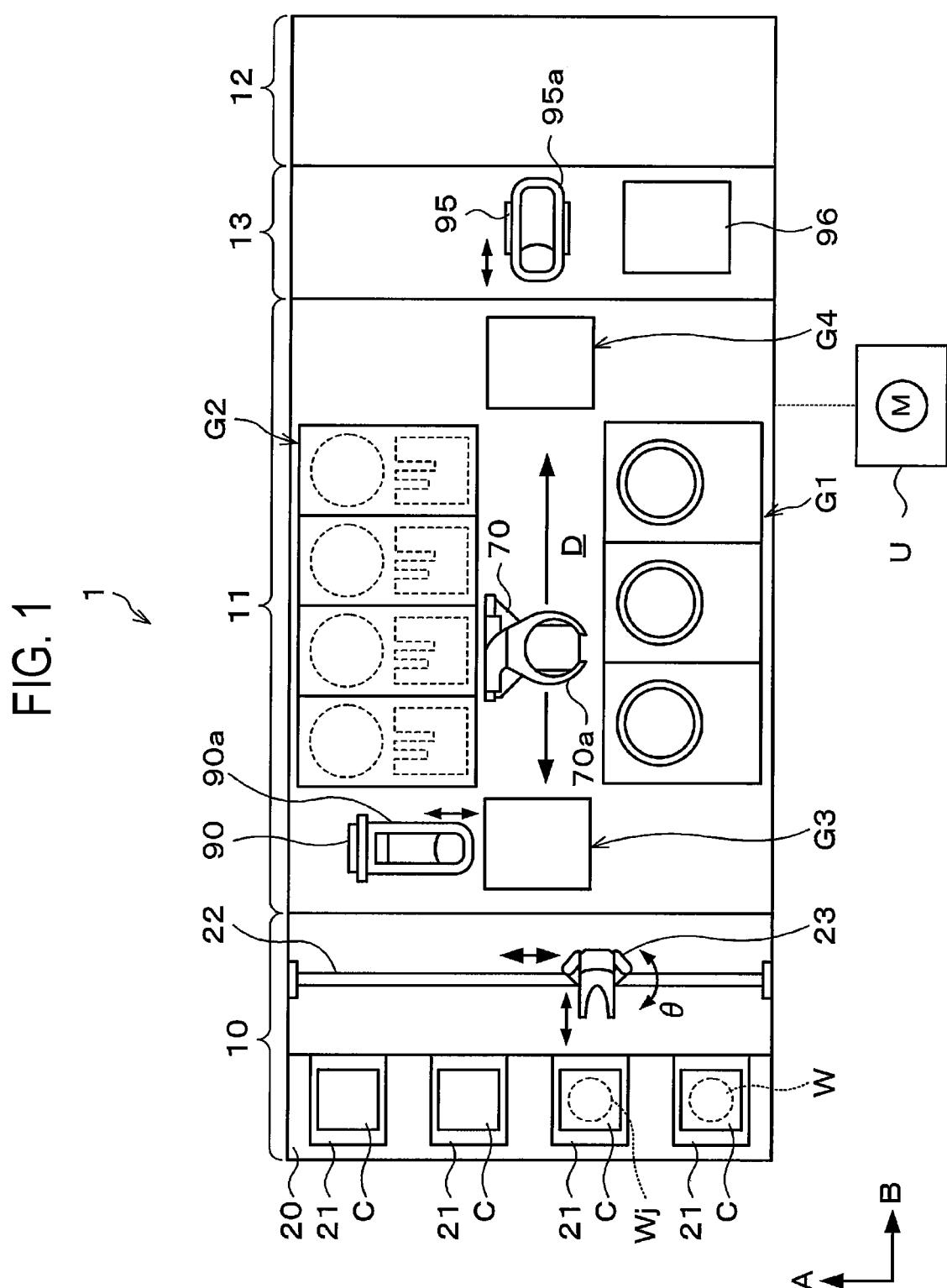
FIG. 1 is an explanatory diagram illustrating an outline of an internal configuration of a wafer processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a process of manufacturing a semiconductor device, and the like, a predetermined processing is performed in order to form a resist pattern on a substrate such as a semiconductor wafer (hereinafter referred to as "wafer"). The predetermined processing is, for example, a resist coating processing of supplying a resist liquid onto the substrate to form a resist coating film. Further, in some instances, a processing (Edge Bead Removal (EBR) processing) of supplying a solvent from a solvent discharge nozzle, disposed above the peripheral edge of the substrate on which the resist film is formed, to remove the resist film from the peripheral edge of the substrate may be performed. The predetermined processing such as the resist coating processing or the EBR processing is performed by a substrate processing apparatus.

By the way, in order to obtain a desired EBR processing result, it is necessary to appropriately set the height of the solvent discharge nozzle from the substrate surface (hereinafter sometimes abbreviated as "the height of the solvent discharge nozzle") within a processing space of the substrate processing apparatus which performs the EBR processing. Therefore, the height of the solvent discharge nozzle is measured or detected during apparatus operation or maintenance.

Further, it is contemplated to load a detection substrate, which is provided with an capturing device for detecting the height of the solvent discharge nozzle, into the processing space of the substrate processing apparatus by a substrate transfer device, to capture an image of the solvent discharge nozzle with the capturing device on the detection substrate, and to detect the height of the solvent discharge nozzle based on the result of capturing.

However, the orientation of the capturing device on the detection substrate is not constant when loaded into the processing space of the substrate processing apparatus by the substrate transfer device. Therefore, it may be necessary to rotate the detection substrate within the processing space before capturing so that the solvent discharge nozzle disposed above the peripheral edge of the detection substrate is within the angle of view of the capturing device on the detection substrate. In this case, the detection substrate may be rotated approximately once depending on the orientation of the capturing device when loaded into the processing space. Further, if an elevated member is provided on the surface of the peripheral edge of the detection substrate when rotating the detection substrate, there is a risk of interference between that elevated member and the solvent discharge nozzle disposed above the peripheral edge of the detection substrate. Therefore, when the detection substrate may be rotated approximately once depending on the orientation of the capturing device as described above, it is not possible to provide the elevated member on the peripheral edge of the detection substrate. The same is also applied to the detection substrate provided with a state detector for detecting the state of a structure within the processing space, other than the capturing device for detecting the height of the solvent discharge nozzle.

Accordingly, a technique according to the present disclosure improves the usability of the detection substrate provided with the state detector such as the capturing device which detects the state of the structure within the processing space of the substrate processing apparatus.

Hereinafter, a detection system and a detection method according to the present embodiment will be described with reference to the accompanying drawings. In addition, in this specification and the accompanying drawings, elements having substantially the same functional configuration will be denoted by the same reference numerals, and redundant descriptions thereof will be omitted.

<Wafer Processing System>

Figure 2:
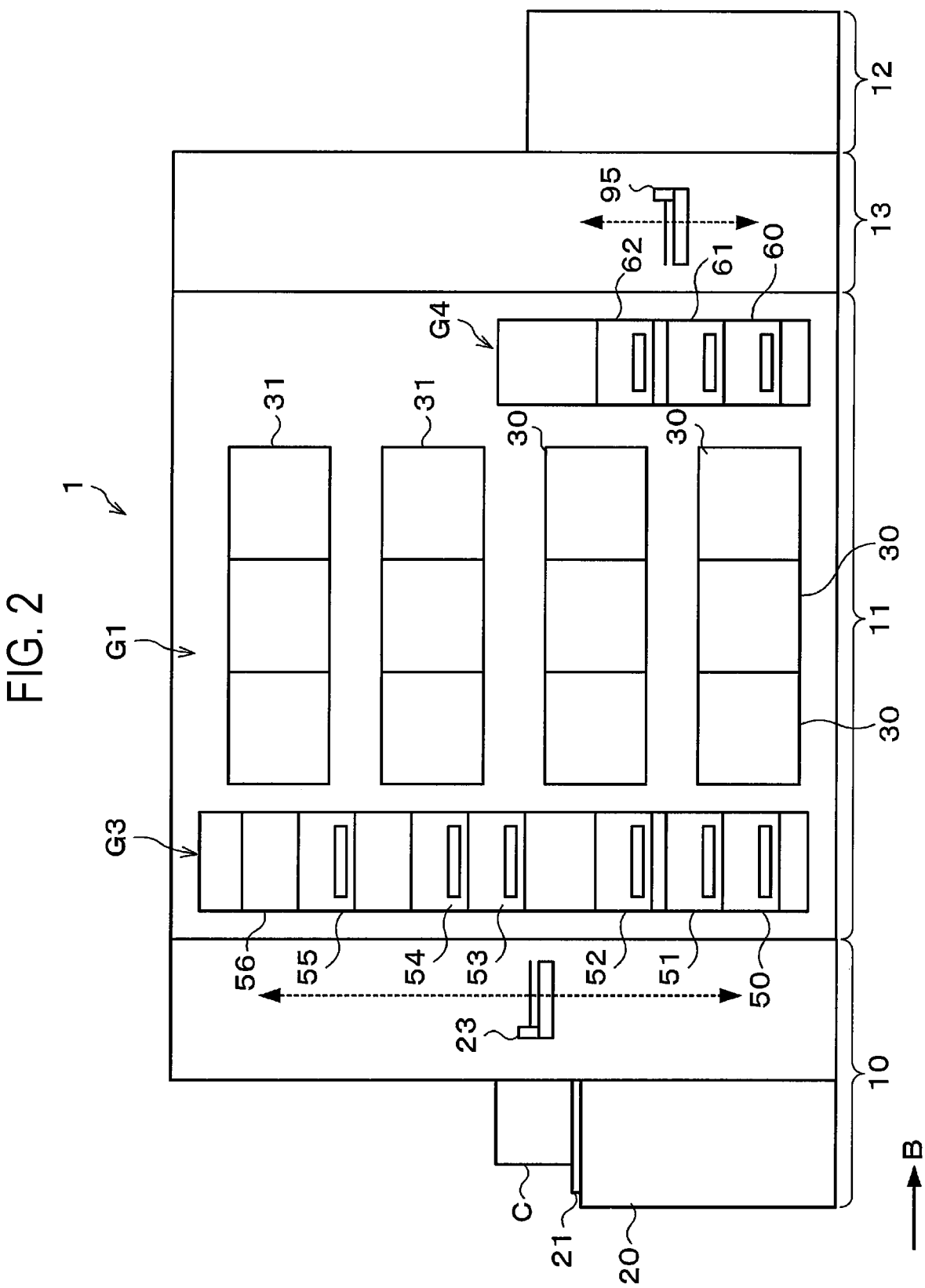
FIG. 2 is a diagram schematically illustrating an outline of an internal configuration at a front side of the wafer processing system.
Figure 3:
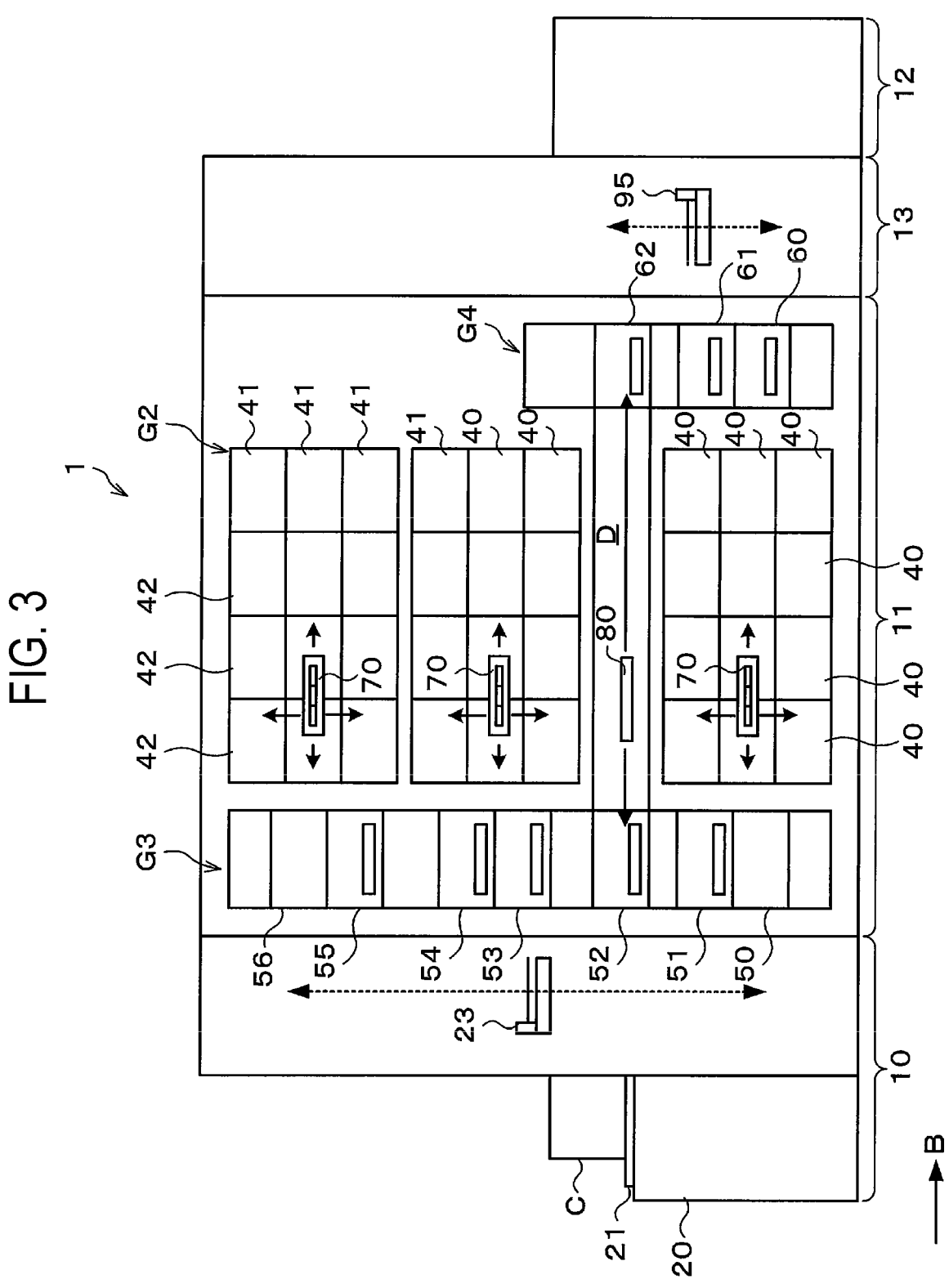
FIG. 3 is a diagram schematically illustrating an outline of an internal configuration at a rear side of the wafer processing system.

FIG. 1 is an explanatory diagram illustrating an outline of an internal configuration of a wafer processing system 1 as a detection system. FIGS. 2 and 3 are diagrams schematically illustrating the outline of the internal configuration at the front side and the rear side of the wafer processing system 1, respectively. In addition, in the following example, the wafer processing system 1 is a coating and developing processing system which performs coating and developing processes on a wafer W.

As illustrated in FIG. 1, the wafer processing system 1 includes a cassette station 10, into and from which a cassette C, which accommodates a plurality of wafers W as substrates, is loaded and unloaded, and a processing station 11 having a plurality of various processing apparatuses, each of which performs a predetermined processing on the wafer W. Also, the wafer processing system 1 has a configuration in which an interface station 13 is integrally connected to transfer the wafer W between the cassette station 10, the processing station 11, and an exposure apparatus 12 adjacent to the processing station 11.

The cassette station 10 is provided with a cassette stage 20. The cassette stage 20 is provided with a plurality of cassette placement plates 21, on each of which the cassette C is placed when loading and unloading the cassette C to and from the outside of the wafer processing system 1. Further, in one embodiment, a detection wafer Wj to be described later is also accommodated in any cassette C.

The cassette station 10 is provided with a wafer transfer device 23, which is movable along a transfer path 22 extending in the A direction in the drawing. The wafer transfer device 23 is movable in the vertical direction and around the vertical axis (the θ direction) and may transfer the wafer W and the detection wafer Wj between the cassette C on each cassette placement plate 21 and a transfer device of a third block G3 of the processing station 11 to be described later.

The processing station 11 is provided with a plurality of, for example, four blocks G1, G2, G3 and G4 each having various apparatuses. For example, a first block G1 is provided on the front side of the processing station 11 (the negative side in the A direction in FIG. 1), and a second block G2 is provided on the rear side of the processing station 11 (the positive side in the A direction in FIG. 1). Further, the third block G3 is provided on the cassette station 10 side of the processing station 11 (the negative side in the B direction in FIG. 1), and a fourth block G4 is provided on the interface station 13 side of the processing station 11 (the positive side in the B direction in FIG. 1).

In the first block G1, as illustrated in FIG. 2, a plurality of liquid processing apparatuses, for example, a developing apparatus 30 and a resist coating apparatus 31 are arranged in this order from the bottom. The developing apparatus 30 performs a developing processing on the wafer W, and the resist coating apparatus 31 coats the wafer W with a resist liquid to form a resist film.

For example, the developing apparatus 30 and the resist coating apparatus 31 are respectively provided side by side in the vertical direction and the horizontal direction. In addition, the number and arrangement of these developing apparatus 30 and resist coating apparatus 31 may be selected arbitrarily.

In the developing apparatus 30 and the resist coating apparatus 31, a predetermined processing liquid is supplied onto the wafer W by a spin coating method, for example. In the spin coating method, for example, the processing liquid is discharged onto the wafer W from a discharge nozzle, and the wafer W is rotated to spread the processing liquid over the surface of the wafer W.

In the second block G2, as illustrated in FIG. 3, there are provided a heat treatment apparatus 40, which performs a heat treatment such as heating or cooling of the wafer W, and an adhesion apparatus 41, which is for increasing the fixing ability of the resist liquid and the wafer W. These heat treatment apparatus 40 and adhesion apparatus 41 are provided side by side in the vertical direction and the horizontal direction, and the number and arrangement thereof may be selected arbitrarily.

For example, in the third block G3, a plurality of transfer devices 50, 51, 52, 53, 54 and 55 are provided in order from the bottom. Further, in the fourth block G4, a plurality of transfer devices 60, 61 and 62 are provided in order from the bottom.

As illustrated in FIG. 1, a wafer transfer area D as a substrate transfer area is defined in an area surrounded by the first block G1 to the fourth block G4. In the wafer transfer area D, a wafer transfer device 70 as a transfer device is arranged.

The wafer transfer device 70 includes a transfer arm 70a, which is movable in the A direction, the B direction, the θ direction, and the vertical direction, for example. The wafer transfer device 70 may move within the wafer transfer area D to transfer the wafer W and the detection wafer Wj to a predetermined apparatus in the first block G1, the second block G2, the third block G3, and the fourth block G4. For example, as illustrated in FIG. 3, a plurality of wafer transfer devices 70 may be arranged vertically to transfer the wafer W and the detection wafer Wj to, for example, predetermined apparatuses at approximately the same height in the respective blocks G1 to G4.

Further, a shuttle transfer device 80 is provided in the wafer transfer area D to transfer the wafer W linearly between the third block G3 and the fourth block G4.

The shuttle transfer device 80 is linearly movable in the B direction in FIG. 3, for example. The shuttle transfer device 80 may move in the B direction while supporting the wafer W to transfer the wafer W between the transfer device 52 of the third block G3 and the transfer device 62 of the fourth block G4.

As illustrated in FIG. 1, a wafer transfer device 90 is provided adjacent to the third block G3 on the positive side in the A direction. The wafer transfer device 90 includes a transfer arm 90a, which is movable in the A direction, the θ direction, and the vertical direction, for example. The wafer transfer device 90 may move vertically while supporting the wafer W to transfer the wafer W to each transfer device in the third block G3.

The interface station 13 is provided with a wafer transfer device 95 and a transfer device 96. The wafer transfer device 95 includes a transfer arm 95a, which is movable in the B direction, the θ direction, and the vertical direction, for example. For example, the wafer transfer device 95 may support the wafer W and the detection wafer Wj by the transfer arm 95a to transfer the wafer W and the detection wafer Wj between each transfer device in the fourth block G4, the transfer device 96, and the exposure apparatus 12.

The above wafer processing system 1 is provided with a control device U, as illustrated in FIG. 1. The control device U is implemented with a computer including, for example, a CPU, a memory, and the like, and includes a program storage (not illustrated). The program storage stores a program for controlling a wafer processing in the wafer processing system 1. Further, the program storage stores a program for detecting the state of a structure located within the processing space of the processing apparatus such as the resist coating apparatus 31 based on the result of detection using the detection wafer Wj to be described later. That is, the program storage stores a program operating on the computer of the control device U which controls the wafer processing system 1, in order to cause the wafer processing system 1 to execute a detection processing using the detection wafer Wj. In addition, the program is recorded on a computer-readable storage medium M and may be installed from the storage medium M on the control device U. The storage medium M may be transitory or non-transitory. Further, a portion or all of the programs may be realized by dedicated hardware (circuit board).

<Resist Coating Apparatus 31>

Figure 4:
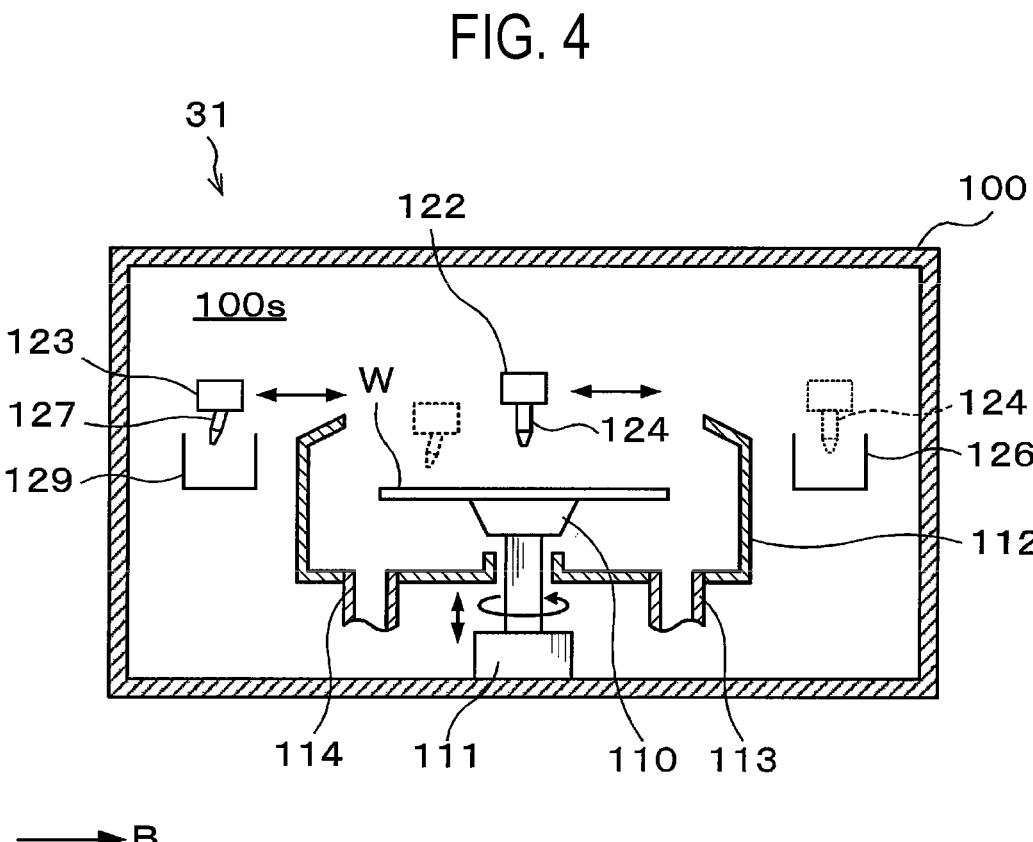
FIG. 4 is a longitudinal-sectional view illustrating an outline of a configuration of a resist coating apparatus.
Figure 5:
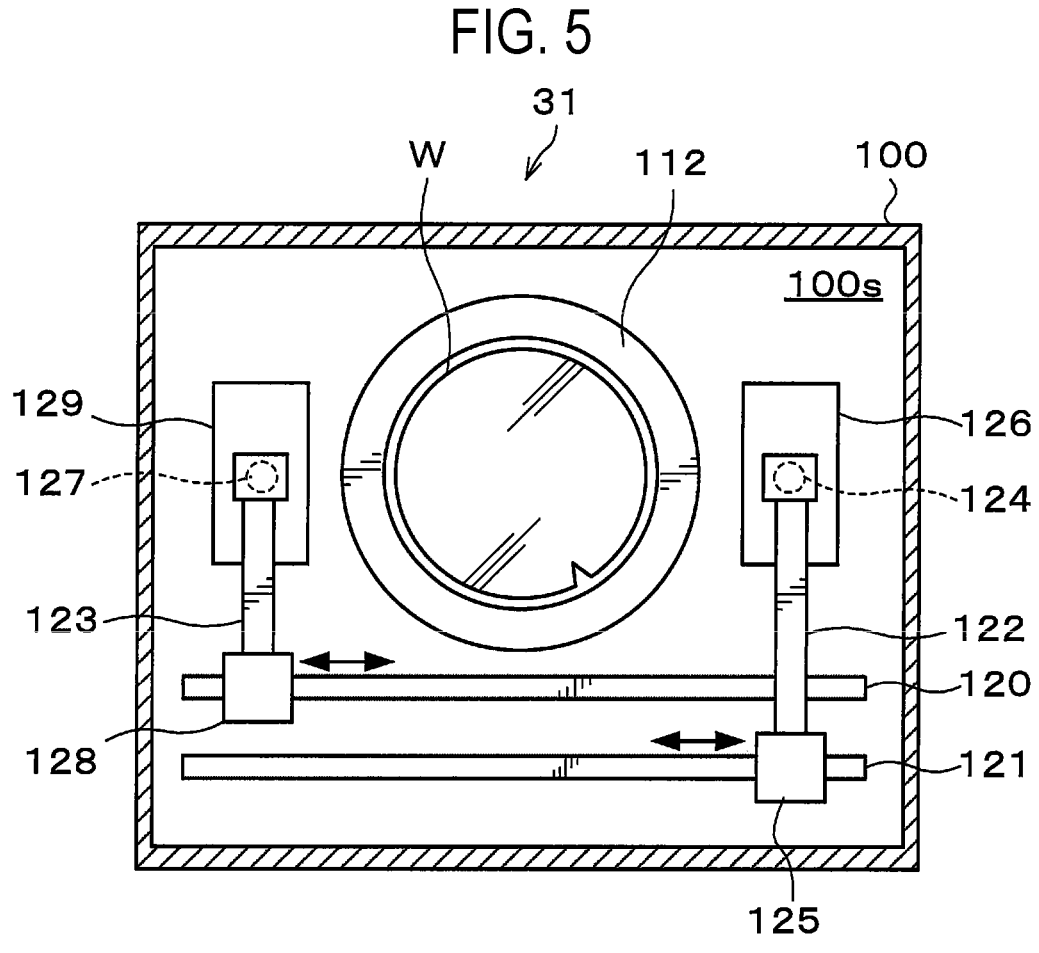
FIG. 5 is a cross-sectional view illustrating the outline of the configuration of the resist coating apparatus.

Next, a configuration of the above-described resist coating apparatus 31 will be described. FIGS. 4 and 5 are a longitudinal-sectional view and a cross-sectional view respectively illustrating an outline of a configuration of the resist coating apparatus 31. As illustrated in FIGS. 4 and 5, the resist coating apparatus 31 includes a processing container 100 having a processing space 100s defined therein, the inside of the processing container 100 being hermetically sealable. The processing container 100 is provided with a loading/unloading port (not illustrated) for the wafer W in the side surface thereof at the wafer transfer device 70 side, and an opening/closing shutter (not illustrated) is provided at the loading/unloading port.

A spin chuck 110 as a substrate holder is provided in a central portion of the processing container 100. The spin chuck 110 serves to hold the wafer W and is rotatably configured. Further, the spin chuck 110 has a horizontal upper surface, and is provided in that upper surface with a suction port (not illustrated) for suctioning the wafer W, for example. The wafer W may be attracted to and held on the spin chuck 110 by the suction from the suction port. The spin chuck 110 may rotate while attracting and holding the detection wafer Wj.

A chuck drive 111 as a rotation mechanism is provided below the spin chuck 110. The chuck drive 111 includes, for example, a motor, and may rotate the spin chuck 110 at a desired speed, thereby allowing the wafer W held by the spin chuck 110 to be rotated at the desired speed. Further, the chuck drive 111 is provided with, for example, a lifting drive source such as a cylinder, whereby the spin chuck 110 is movable up and down.

A cup 112 is provided around the spin chuck 110 and is configured to receive and collect a liquid scattered or falling from the wafer W. The lower surface of the cup 112 is connected to a discharge pipe 113 for discharging the collected liquid and an exhaust pipe 114 for vacuum-evacuating the atmosphere inside the cup 112.

As illustrated in FIG. 5, rails 120 and 121 extending along the B direction (the transversal direction in FIG. 5) are formed on the negative side in the A direction of the cup 112 (the lower side in FIG. 5). For example, the rails 120 and 121 are formed from the outside of the cup 112 on the negative side in the B direction (the left side in FIG. 5) to the outside of the cup 112 on the positive side in the B direction (the right side in FIG. 5). The rails 120 and 121 are provided, respectively, with a first arm 122 and a second arm 123.

As illustrated in FIGS. 4 and 5, a resist discharge nozzle 124 for discharging a resist liquid to supply it onto the wafer W is supported by the first arm 122. The first arm 122 is movable on the rail 120 by a nozzle drive 125 illustrated in FIG. 5. Thereby, the resist discharge nozzle 124 may move from a standby part 126, which is provided outside the cup 112 on the positive side in the B direction, to above a central portion of the wafer W within the cup 112. Further, the first arm 122 is movable up and down by the nozzle drive 125 and may adjust the height of the resist discharge nozzle 124.

A resist liquid source (not illustrated) is connected to the resist discharge nozzle 124. Further, a supply pipe (not illustrated) between the resist discharge nozzle 124 and the resist liquid source is provided with a supply device group including a valve, a flow rate adjustor, and the like for controlling a flow of the resist liquid.

As illustrated in FIGS. 4 and 5, a solvent discharge nozzle 127 is supported by the second arm 123. The solvent discharge nozzle 127 is an example of a structure, and discharges, as a removal liquid for removing the peripheral edge of a resist film formed on the surface of the wafer W, a solvent for the resist film, to supply the same onto the wafer W. The second arm 123 is movable on the rail 120 by a nozzle drive 128. Thereby, the solvent discharge nozzle 127 may move from a standby part 129, which is provided outside the cup 112 on the negative side in the B direction, to above a peripheral edge region of the wafer W within cup 112. Further, the second arm 123 is movable up and down by the nozzle drive 128 and may adjust the height of the solvent discharge nozzle 127.

A solvent source (not illustrated) is connected to the solvent discharge nozzle 127. Further, a supply pipe (not illustrated) between the solvent discharge nozzle 127 and the solvent source is provided with a supply device group including a valve, a flow rate adjuster, and the like for controlling a flow of the solvent.

<Detection Wafer>

In the wafer processing system 1 having the resist coating apparatus 31 as described above, a height of the solvent discharge nozzle 127 on the basis of the wafer W held by the spin chuck 110 (hereinafter abbreviated as "the height of the solvent discharge nozzle 127") is detected during apparatus operation or maintenance. In the present embodiment, the detection wafer Wj as a detection substrate is used to detect the height of the solvent discharge nozzle 127.

Figure 6:
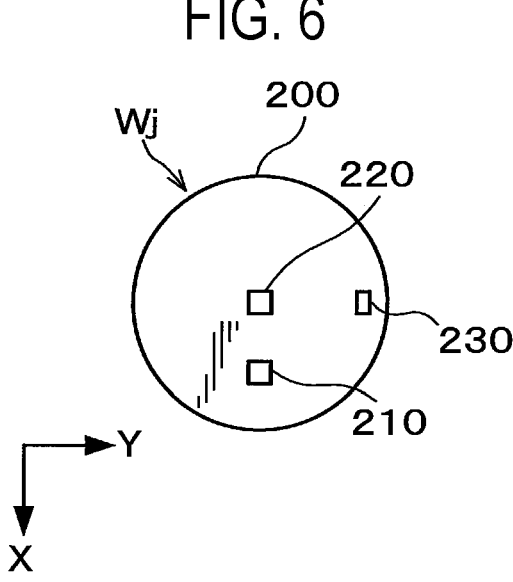
FIG. 6 is a plan view illustrating an outline of an example of a detection wafer.

FIG. 6 is a side view and a plan view illustrating the outline of an example of the detection wafer Wj. The detection wafer Wj includes a main body 200 formed in the same shape as the wafer W. A camera 210 and an acceleration sensor 220 are provided on the surface of the detection wafer Wj (specifically, on the upper surface of the main body 200).

The camera 210 is an example of a state detector and an example of a capturing device, and is for detecting the height of the solvent discharge nozzle 127. The camera 210 captures an image of the solvent discharge nozzle 127, and the like.

The acceleration sensor 220 is an example of an acceleration detector, and detects an acceleration in each of a first direction and a second direction which are two directions intersecting each other in the surface of the detection wafer Wj. In the present embodiment, the first and second directions are the X direction and the Y direction of FIG. 6 orthogonal to each other, respectively.

Further, in the present embodiment, the camera 210 is provided on a straight line, which passes through the center of the detection wafer Wj in plan view, that is, the center of the main body 200 in plan view and which is parallel to the X direction of the drawing. The camera 210 is provided on the positive side in the X direction. Further, the camera 210 is provided at a position toward the wafer center where it does not interfere with the solvent discharge nozzle 127 when the solvent discharge nozzle 127 is located above the peripheral edge of the detection wafer Wj.

Furthermore, the detection wafer Wj may be provided with an elevated member 230, which is higher than the height of the solvent discharge nozzle 127, on the upper surface of the peripheral edge of the main body 200. The elevated member 230 is, for example, another detector that detects the state of a structure within the processing space 100s other than the solvent discharge nozzle 127.

Further, the detection wafer Wj includes a power supply (not illustrated) and a controller (not illustrated). The controller of the detection wafer Wj includes a processor and a storage, and executes a program stored in the storage to allow the result of capturing by the camera 210 and the result of detection by the acceleration sensor 220 to be transmitted to the control device U by wireless communication, or the like under the control thereof.

<Principle of Estimating Orientation of Camera 210 on Detection Wafer Wj>

Figure 7:
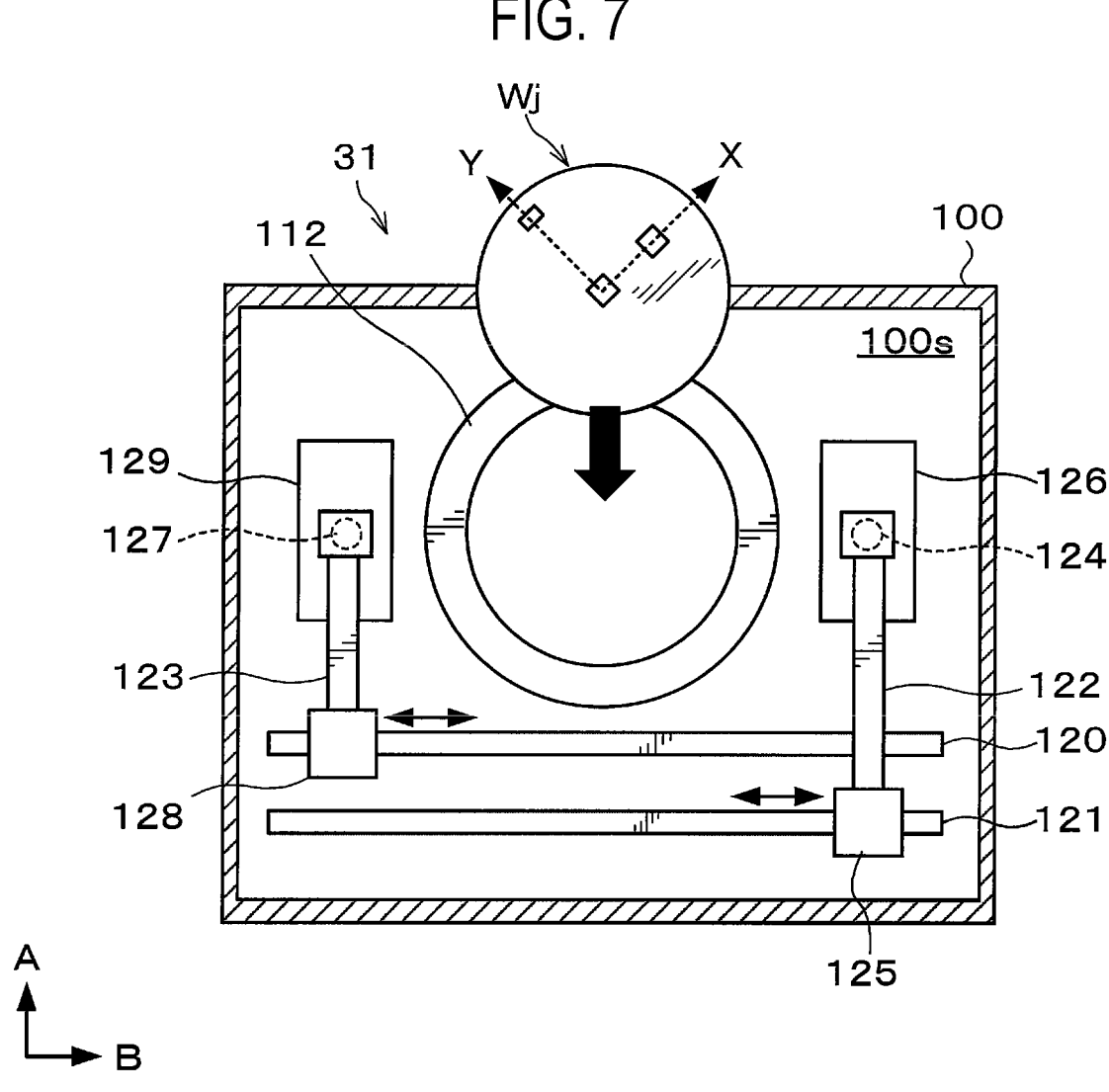
FIG. 7 is a diagram illustrating a principle of estimating an orientation of a camera on the detection wafer within a processing space.

In the present embodiment, when detecting the height of the solvent discharge nozzle 127 using the detection wafer Wj, the detection wafer Wj is loaded into the processing container 100, that is, into the processing space 100s by the wafer transfer device 70, as illustrated in FIG. 7. Then, prior to detecting the height of the solvent discharge nozzle 127, the orientation of the camera 210 on the detection wafer Wj within the processing space 100s after loading is estimated.

Hereinafter, first, the principle of estimating the orientation of the camera 210 (that is, the position of the camera in the circumferential direction) on the detection wafer Wj within the processing space 100s in the present embodiment will be described with reference to FIGS. 8 and 9. In addition, in the present embodiment, the "circumferential direction" refers to the circumferential direction about the rotation center of the spin chuck 110.

As described above, the detection wafer Wj is loaded into the processing space 100s by the wafer transfer device 70 when detecting the height of the solvent discharge nozzle 127. At this time, the detection wafer Wj linearly moves from a predetermined position out of the processing space 100s to a position immediately above the spin chuck 110 within the processing space 100s. Further, at this time, the history of speed of the detection wafer Wj is not complicated. For example, the speed has a history of gradually increasing from zero, and after reaching a predetermined value, gradually decreasing and returning to zero.

Figure 8:
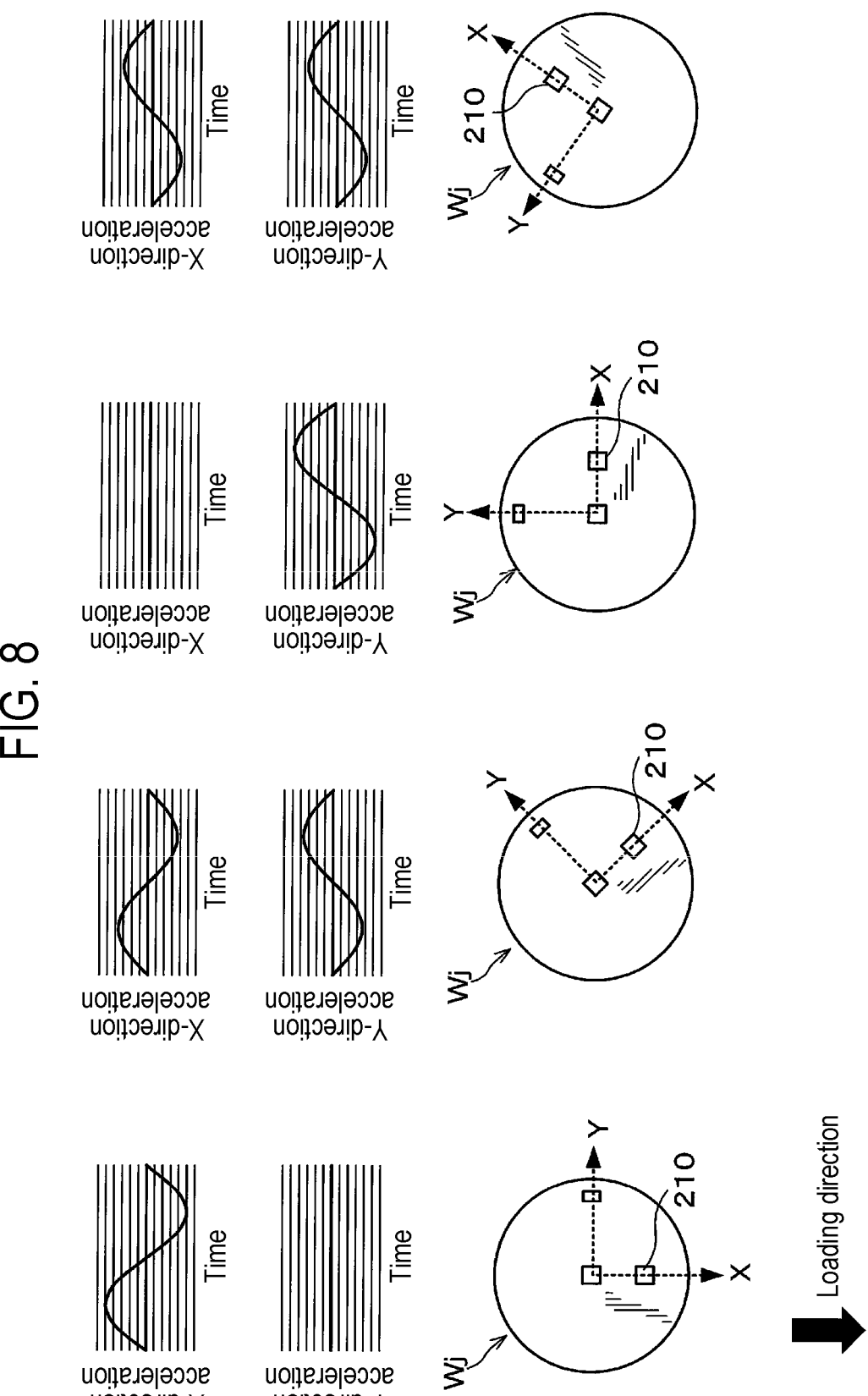
FIG. 8 is a diagram illustrating the principle of estimating the orientation of the camera on the detection wafer within the processing space.
Figure 9:
FIG. 9 is a diagram illustrating the principle of estimating the orientation of the camera on the detection wafer within the processing space.
Figure 9:
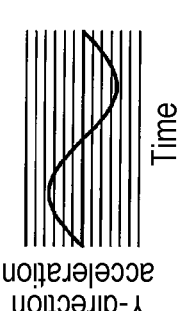
Figure 9:
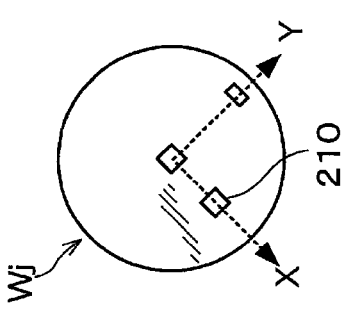
Figure 9:
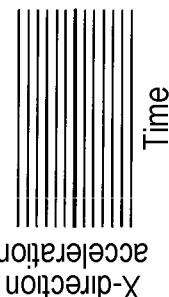
Figure 9:
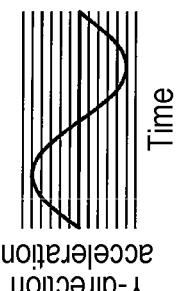
Figure 9:
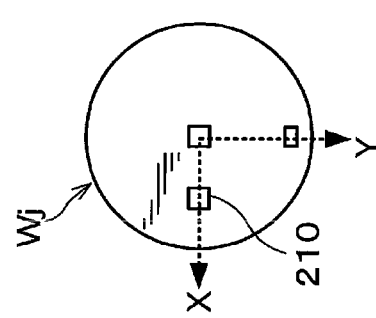
Figure 9:
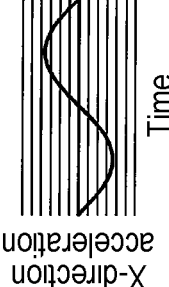
Figure 9:
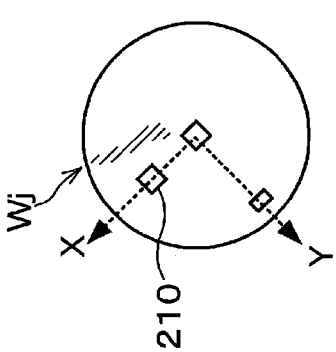
Figure 9:
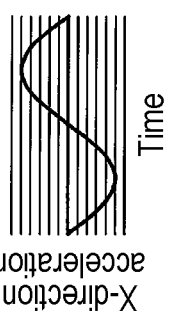
Figure 9:
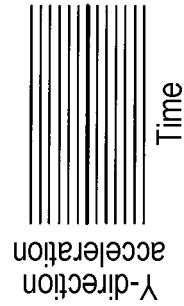
Figure 9:
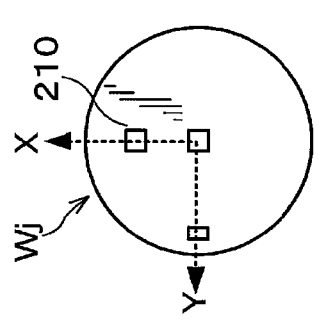
Figure 9:

Therefore, there is a correlation as illustrated in FIGS. 8 and 9 between the orientation of the detection wafer Wj when moving in the loading/unloading direction (specifically, in the loading direction) by the wafer transfer device 70 (hereinafter referred to as "the orientation of the detection wafer Wj during transfer") and the result of detection by the acceleration sensor 220.

To describe excerpts thereof, for example, as illustrated in the left side of FIG. 8, when the orientation of the detection wafer Wj during transfer is in an orientation where the loading direction and the positive side in the X direction match, the acceleration in the X direction detected by the acceleration sensor 220 during transfer gradually increases, then changes to a decrease, and then increases again. On the other hand, the acceleration in the Y direction detected by the acceleration sensor 220 is always zero during transfer.

Further, as illustrated in the center right side of FIG. 9, when the orientation of the detection wafer Wj during transfer is in an orientation where the loading direction and the positive side in the Y direction match, the acceleration in the Y direction detected by the acceleration sensor 220 during transfer gradually increases, then changes to a decrease, and then increases again. On the other hand, the acceleration in the X direction detected by the acceleration sensor 220 is always zero during transfer.

Furthermore, as illustrated in the right side of FIG. 8, when the orientation of the detection wafer Wj during transfer is in an orientation where the positive side in the X direction forms an angle of 135 degrees with the loading direction, the acceleration in the X direction detected by the acceleration sensor 220 during transfer gradually decreases, then changes to an increase, and then decreases again. The same is also applied to the acceleration in the Y direction detected by the acceleration sensor 220 during transfer.

Further, as illustrated in the right side of FIG. 9, when the orientation of the detection wafer Wj during transfer is in an orientation where the positive side in the X direction forms an angle of 315 degrees with the loading direction, the acceleration in the X direction detected by the acceleration sensor 220 during transfer gradually increases, then changes to a decrease, and then increases again. The same is also applied to the acceleration in the Y direction detected by the acceleration sensor 220 during transfer.

Then, the orientation of the detection wafer Wj during transfer and the orientation of the camera 210 on the detection wafer Wj within the processing space 100s after loading (hereinafter referred to as "the orientation of the camera 210 within the processing space 100s") have a certain relationship.

Thus, in the present embodiment, the control device U estimates the orientation of the camera 210 within the processing space 100s based on the result of detection by the acceleration sensor 220 when the detection wafer Wj is moved in the loading direction during loading of that detection wafer Wj into the processing space 100s. A detailed estimation method will be described later.

<Detection of Height of Solvent Discharge Nozzle 127>

Figure 10:
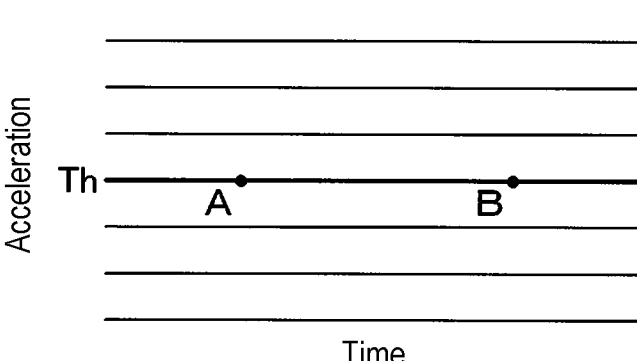
FIG. 10 is a diagram illustrating examples of a pattern that is adoptable by a history of acceleration during loading of the detection wafer.
Figure 10:
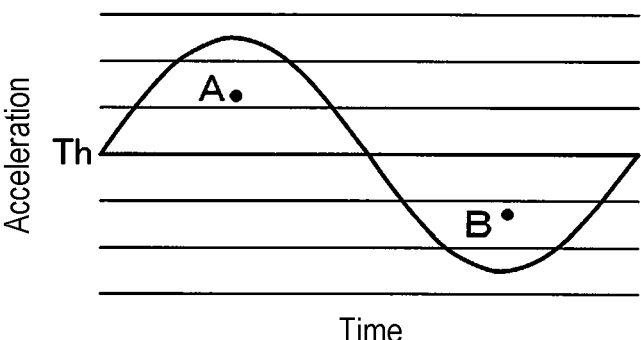
Figure 10:
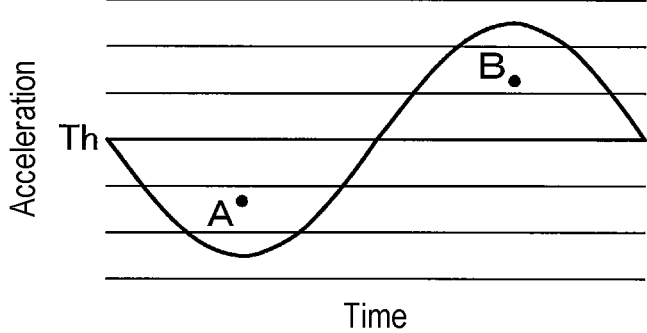
Figure 13:
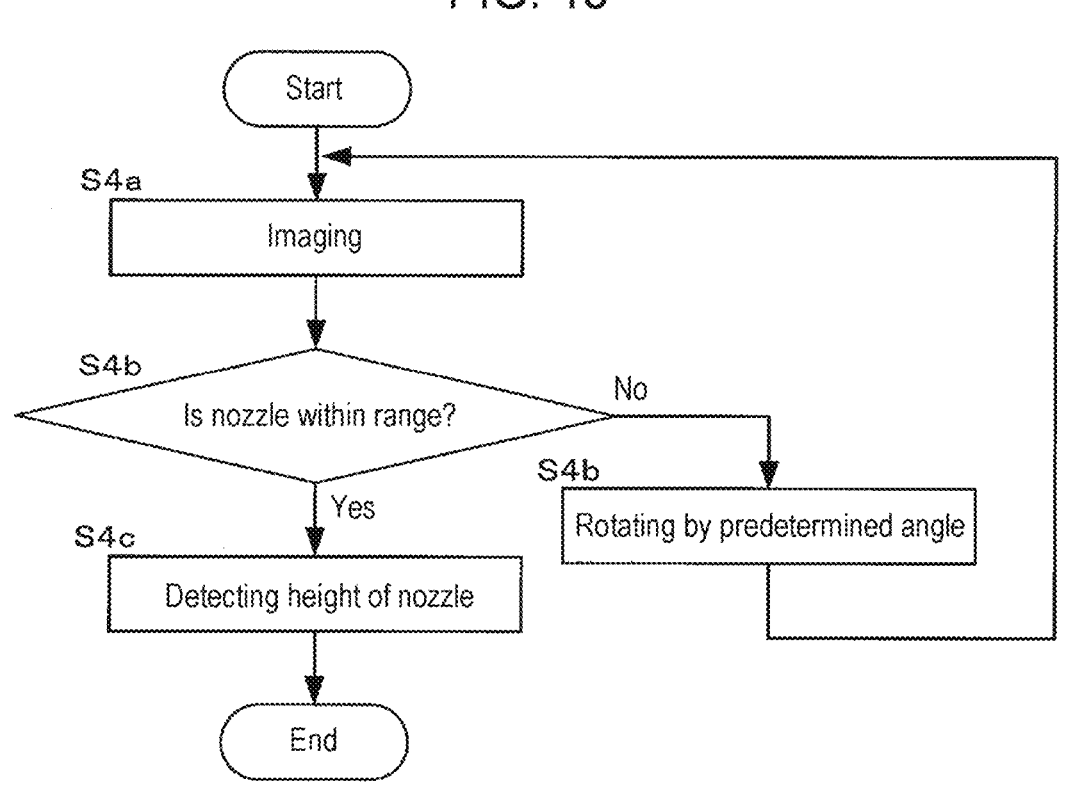
FIG. 13 is a flowchart illustrating an example of a detection operation of step S4.

Next, an example of a processing of detecting the height of the solvent discharge nozzle 127 using the detection wafer Wj in the wafer processing system 1 will be described with reference to FIGS. 10 to 13. FIG. 10 is a diagram illustrating an example of patterns that are adoptable by the history of acceleration during loading of the detection wafer Wj. FIG. 11 is a diagram illustrating an example of a table used for estimating the orientation of the camera 210 within the processing space 100s. FIGS. 12A and 12B are diagrams illustrating an example of a positional relationship between the solvent discharge nozzle 127 and the detection wafer Wj during a processing of detecting the height of the solvent discharge nozzle 127. FIG. 13 is a flowchart illustrating an example of a detection operation of step S4 to be described later.

(Step S1: Loading and Detection of Acceleration)

First, under the control of the control device U, the detection wafer Wj is loaded by the wafer transfer device 70 into the processing space 100s of the resist coating apparatus 31, and the acceleration of the detection wafer Wj during loading is detected by the acceleration sensor 220.

Specifically, first, the detection wafer Wj is taken out from the cassette C on the cassette stage 20 and is held by the transfer arm 70a of the wafer transfer device 70 under the control of the control device U. Thereafter, under the control of the control device U, the detection wafer Wj held by the transfer arm 70a moves linearly along the loading direction from a predetermined position outside the resist coating apparatus 31 to a position immediately above the spin chuck 110 within the processing space 100s of that resist coating apparatus 31. Subsequently, the detection wafer Wj is transferred from the transfer arm 70a to the spin chuck 110 under the control of the control device U. After transfer, the transfer arm 70a is extracted from the resist coating apparatus 31.

Further, during linear movement in the loading direction described above, the acceleration of the detection wafer Wj in each of the X direction and the Y direction is detected by the acceleration sensor 220 on the detection wafer Wj. The detected result of acceleration is transmitted to the control device U by wireless communication.

(Step S2: Estimation of Orientation of Camera 210 within Processing Space 100s)

Next, the control device U estimates the orientation of the camera 210 within the processing space 100s based on the detected result of acceleration in step 51.

Specifically, patterns that are adoptable by the history of acceleration during linear movement in the loading direction are classified in advance, and information for the classification (hereinafter referred to as "classification information") is stored in the storage (not illustrated). Then, the control device U determines, based on the classification information, which one of the patterns corresponds to the history of acceleration detected by the acceleration sensor 220 in each of the X direction and the Y direction, and based on the result of determination, estimates the orientation of the camera 210 within the processing space 100s.

That is, the control device U determines which one of the previously classified patterns that are adoptable by the history of acceleration during movement in the loading/unloading direction corresponds to the history of acceleration detected by the acceleration sensor 220 in each of the X direction and the Y direction, and based on the result of determination, estimates the orientation of the camera 210 within the processing space 100s.

Further, the control device U determines which one of the patterns corresponds to the history of acceleration detected by the acceleration sensor 220 based on a magnitude relationship between the acceleration during a first half of linear movement in the loading direction and the acceleration during a second half of linear movement in the loading direction.

Hereinafter, a more specific description will be given. Here, the index A indicating the history of acceleration during the first half of the above movement and the index B indicating the history of acceleration during the second half of the above movement will be defined as follows.

$A = \alpha f - \alpha t$ $B = \alpha b - \alpha t$ $\alpha f$: average of the acceleration during the first half of the above movement $\alpha b$: average of the acceleration during the second half of the above movement $\alpha t$: average of the total acceleration during linear movement in the loading direction The control device U determines, based on the index A and the index B, which one of the following patterns (1) to (3) corresponds to the history of acceleration detected by the acceleration sensor 220. In addition, when the absolute value of A-B is a predetermined value or less, it is determined that the history of acceleration corresponds to the following pattern (2).

(1) A>B pattern (as illustrated in the middle of FIG. 10)

(2) A≈B pattern (as illustrated in the top of FIG. 10)

(3) A<B pattern (as illustrated in the bottom of FIG. 10)

Then, the control device U estimates the orientation of the camera 210 within the processing space 100s (specifically, the range of the orientation of the camera 210 within processing space 100s) based on the result of determination regarding the above patterns and the table T of FIG. 11, for example. The table T is an example of information indicating a correspondence relationship between the pattern of the history of acceleration in the X direction, the pattern of the history of acceleration in the Y direction, and the orientation of the camera 210 within the processing space 100s.

For example, when the history of acceleration detected in the X direction is (1) A>B pattern and the history of acceleration detected in the Y direction is (2) A≈B pattern, the control device U estimates the range of the orientation of the camera 210 within the processing space 100s to 0±45 degrees based on the table T of FIG. 11.

In addition, instead of a combination of the above-described patterns (1), (2) and (3), a combination of the following patterns (1a), (2a) and (3a) and a combination of the following patterns (1b), (2b) and (3b) may be used as the pattern of the history of acceleration detected by the acceleration sensor 220.

(1a) A>threshold Th pattern (as illustrated in the middle of FIG. 10)

(2a) A≈threshold Th pattern (as illustrated in the top of FIG. 10)

(3a) A<threshold Th pattern (as illustrated in the bottom of FIG. 10)

(1b) B<threshold Th pattern (as illustrated in the middle of FIG. 10)

(2b) B≈threshold Th pattern (as illustrated in the top of FIG. 10)

(3b) B>threshold Th pattern (as illustrated in the bottom of FIG. 10)

In this case, the control device U determines which one of the patterns (1a), (2a) and (3a), or which one of the patterns (1b), (2b) and (3b) corresponds to the history of acceleration detected by the acceleration sensor 220. Then, the control device U estimates the orientation of the camera 210 within the processing space 100s based on the result of determination and the table similar to the table of FIG. 11.

(Step S3: Correction of Orientation of Camera 210 within Processing Space 100s)

After estimating the orientation of the camera 210 within the processing space 100s, the control device U corrects the orientation of the camera 210 to an orientation corresponding to the solvent discharge nozzle 127 by rotating the spin chuck 110 holding the detection wafer Wj based on the result of estimation and information on the position of the solvent discharge nozzle 127 in the circumferential direction within the processing space 100s.

For example, as illustrated to FIG. 12A, the control device U corrects the orientation of the camera 210 so that a portion of the detection wafer Wj corresponding to the maximum value of the range R of the orientation of the camera 210 faces the solvent discharge nozzle 127.

In addition, the control device U may correct the orientation of the camera 210 so that a portion of the detection wafer Wj corresponding to the minimum value of the range R of the orientation of the camera 210 faces the solvent discharge nozzle 127.

Further, the correction of the orientation of the camera 210 is performed in a state in which the solvent discharge nozzle 127 is retracted from a region where it overlaps with the detection wafer Wj in plan view, as illustrated in FIG. 12A. This is to avoid interference between the solvent discharge nozzle 127 and the above-described elevated member 230 during correction.

(Step S4: Detection of Height of Solvent Discharge Nozzle 127)

Subsequently, as illustrated in FIG. 12B, under the control of the control device U, the solvent discharge nozzle 127 is moved to the region where it overlaps with the detection wafer Wj, and thereafter the height of the solvent discharge nozzle 127 is detected.

In step S4, specifically, first, as illustrated in FIG. 13, capturing is performed by the camera 210 under the control of the control device U (in step S4a). The result of capturing is output to the control device U.

Subsequently, the control device U determines whether or not the solvent discharge nozzle 127 is within the range of detection by the camera 210, that is, whether or not the solvent discharge nozzle 127 is within an image captured by the camera 210 (in step S4b).

When the solvent discharge nozzle 127 is not within the range of detection by the camera 210 ("NO"), the detection wafer Wj held by the spin chuck 110 is rotated by a predetermined angle (for example, 10 degrees) under the control of the control device U (step S4d). After that, the operation returns to step S4a, and capturing is again performed by the camera 210 under the control of the control device U.

That is, the detection wafer Wj is rotated step by step until the solvent discharge nozzle 127 is within the range of detection by the camera 210.

Then, as the result of determination in step S4b, when the solvent discharge nozzle 127 is determined to be within the range of detection by the camera 210, that is, within the image captured by the camera ("YES"), the control device U detects the height of the solvent discharge nozzle 127 based on the result of capturing by the camera 210 (in step S4c).

<Another Example of Detection Timing of Acceleration>

In the above description, when loading the detection wafer Wj into the processing space 100s, the acceleration is detected by the acceleration sensor 220, and the result of detection is used to estimate the orientation of the camera 210 within the processing space 100s. Alternatively, as the detection wafer Wj is loaded into the processing space 100s, then unloaded from the processing space 100s, and again returned into the processing space 100s, the acceleration when the detection wafer Wj is linearly moved in the loading/unloading direction of the detection wafer Wj during unloading may be detected by the acceleration sensor 220, and the result of detection may be used to estimate the orientation of the camera 210.

<Major Effects of Present Embodiment>

As described above, in the present embodiment, the acceleration sensor 220 is provided on the detection wafer Wj, which is provided with the camera 210 used for detecting the height of the solvent discharge nozzle 127. Further, in the present embodiment, the orientation of the camera 210 within the processing space 100s is estimated based on the result of detection by the acceleration sensor 220 when the detection wafer Wj is linearly moved in the loading/unloading direction upon loading or unloading of that detection wafer Wj into or from the processing space 100s. Therefore, according to the present embodiment, the orientation of the camera 210 within the processing space 100s may be corrected, prior to detecting the height of the solvent discharge nozzle 127, based on the result of estimation. As a result, it is possible to restrict the amount of rotation of the detection wafer Wj required to adjust the orientation of the camera 210 relative to the position of the solvent discharge nozzle 127. Thus, even if the elevated member 230 as described above is provided, it does not interfere with the solvent discharge nozzle 127 disposed above the peripheral edge of the detection wafer Wj. Accordingly, according to the present embodiment, the detection wafer Wj may be more efficiently utilized.

Further, according to the present embodiment, the detection wafer Wj may be shared between different resist coating apparatuses 31. Therefore, it is not necessary to provide, within the processing space 100s, a unit for detecting the orientation of the camera 210 within the processing space 100s for each resist coating apparatus 31. Accordingly, it is possible to restrict an increase in the cost of the entire wafer processing system 1.

<Another Example 1 of Method of Estimating Orientation of Camera 210 Within Processing Space 100s Based on Detected Result of Acceleration>

Figures 14, 15:
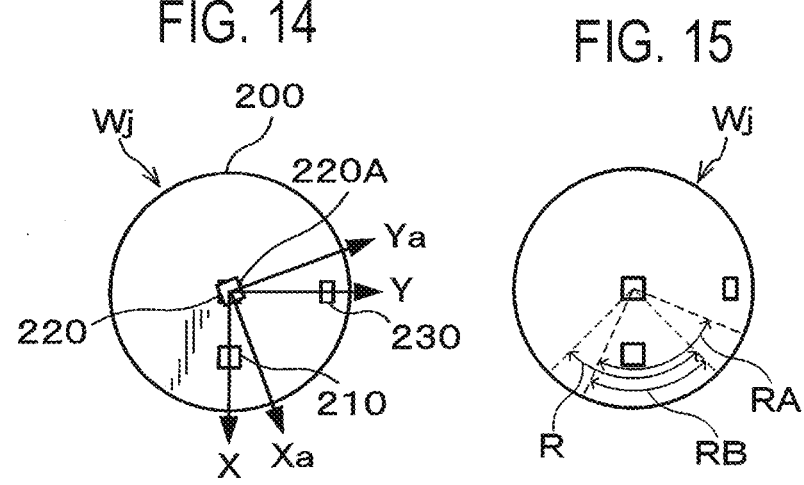
FIG. 14 is a diagram illustrating another example of a method of estimating the orientation of the camera within the processing space based on the detected result of acceleration.
FIG. 15 is a diagram illustrating another example of the method of estimating the orientation of the camera within the processing space based on the detected result of acceleration.

In the above example, although one acceleration sensor 220 is provided on the detection wafer Wj, in addition to this acceleration sensor 220, as illustrated in FIG. 14, an acceleration sensor 220A for detecting the acceleration in a different direction from that of the acceleration sensor 220 may be provided on the detection wafer Wj. The acceleration sensor 220A detects, for example, the acceleration regarding the Xa direction that forms an angle of +22.5 degrees with the X direction and the acceleration regarding the Ya direction that forms an angle of +22.5 degrees with the Y direction.

In this case, as illustrated in FIG. 15, the control device U newly estimates, as the range RB of the orientation of the camera 210, an overlapping range of a range R of the orientation of the camera 210 estimated based on the result of detection by the acceleration sensor 220 and a range RA of the orientation of the camera 210 estimated based on the result of detection by the acceleration sensor 220A. For example, the precision of the orientation of the camera 210 estimated based on the result of detection by one acceleration sensor 220 is ±45 degrees, but the precision of the orientation of the camera may be ±25 degrees when using two acceleration sensors 220 and 220A as described above.

<Another Example 2 of Method of Estimating Orientation of Camera 210 Within Processing Space 100s Based on Detected Result of Acceleration>

The estimation of the orientation of the camera 210 within the processing space 100s based on the detected result of acceleration may be performed as follows.

Figure 16:
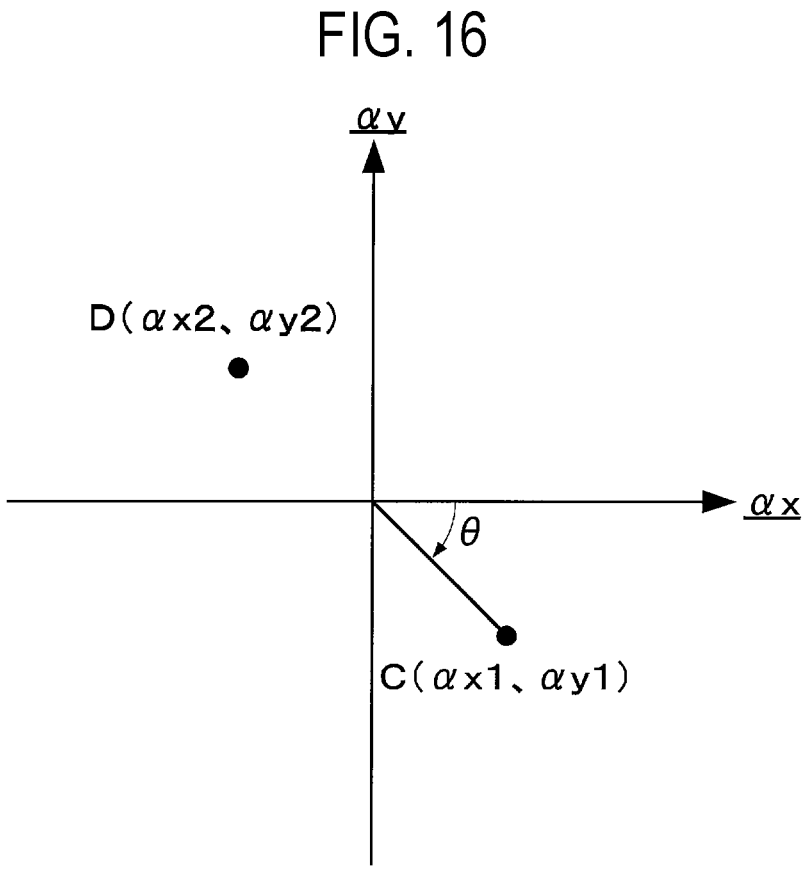
FIG. 16 is a diagram illustrating another example of the method of estimating the orientation of the camera within the processing space based on the detected result of acceleration.

In this estimation method, as illustrated in FIG. 16, an acceleration plane PL in which each of the acceleration $\alpha x$ in the X direction and the acceleration $\alpha y$ in the Y direction is defined as an axis may be considered.

Then, the control device U estimates the orientation of the camera 210 within the processing space 100s based on at least one of the following point C or point D in the acceleration plane PL.

Point C $(\alpha x1, \alpha y1)$

Point D $(\alpha x2, \alpha y2)$ $\alpha x1$ is the acceleration in the X direction during the first half of linear movement in the loading direction, and more specifically, is, for example, the above-described index A indicating the history of acceleration in the X direction during the first half of the above movement.

$\alpha y1$ is the acceleration in the Y direction during the first half of the above movement, and more specifically, is, for example, the above-described index B indicating the history of acceleration in the Y direction during the first half of the above movement.

$\alpha x2$ is the acceleration in the X direction during the second half of the above movement, and more specifically, is, for example, the above-described index A indicating the history of acceleration in the X direction during the second half of the above movement.

$\alpha y2$ is the acceleration in the Y direction during the second half of the above movement, and more specifically is, for example, the above-described index B indicating the history of acceleration in the Y direction during the second half of the above movement.

Then, the control device U estimates, as the orientation of the camera 210 within the processing space 100s, the angle $\theta$ formed between the vector, which is directed from the origin point to the point C, and the positive side of the $\alpha x$-axis, for example, in the acceleration plane PL.

<Another Example of Detection Target by Camera 210>

In the above, the height of the solvent discharge nozzle 127 is detected based on the result of capturing by the camera 210. In addition to this, the height of a predetermined portion of the cup 112 may be detected, for example, based on the result of capturing by the camera 210. This detection is performed, for example, on a plurality of locations (for example, 6 locations) spaced apart from each other in the circumferential direction.

In addition, the camera for detecting the height of the predetermined portion of the cup 112 may be provided on the detection wafer Wj separately from the camera 210.

According to the present disclosure in some embodiments, it is possible to more effectively utilize the usability a detection substrate provided with a state detector such as a capturing device that detects a state of a structure inside a processing space of a substrate processing apparatus.

The embodiments disclosed herein should be considered to be exemplary and not limited in all respects. The above embodiments may be omitted, replaced or modified in various embodiments without departing from the scope of the appended claims and their gist.

What is claimed is:

1. A detection system provided with a substrate processing apparatus that processes a substrate and configured to detect a state of a structure within a processing space of the substrate processing apparatus, the detection system comprising:

a detection substrate including a camera configured to detect the state of the structure other than the detection substrate;

a transfer device configured to load and unload each of a substrate to be processed and the detection substrate into and from the processing space of the substrate processing apparatus; and a control device, wherein the detection substrate further includes at least one acceleration detector configured to detect an acceleration in each of two directions orthogonal to each other in a surface of the substrate, and wherein the control device estimates a position range of the camera in a circumferential direction on the detection substrate within the processing space based on a detection result obtained by the at least one acceleration detector when the detection substrate is moved in a loading/unloading direction during loading or unloading of the detection substrate into or from the processing space.

2. The detection system of claim 1, wherein patterns that are adoptable by a history of acceleration during the movement in the loading/unloading direction are classified in advance, and wherein the control device determines which one of the patterns corresponds to the history of acceleration detected by the at least one acceleration detector in each of the two directions orthogonal to each other, and estimates the position range based on a result of determination.

3. The detection system of claim 2, wherein the control device determines which one of the patterns corresponds to the history of acceleration detected by the at least one acceleration detector based on a magnitude relationship between a first acceleration during a first half of the movement in the loading/unloading direction and a second acceleration during a second half of the movement in the loading/unloading direction.

4. The detection system of claim 1, wherein the at least one acceleration detector of the detection substrate includes a first acceleration detector and a second acceleration detector, wherein the first acceleration detector and the second acceleration detector measure accelerations in different directions, respectively, and wherein the control device estimates that the position range is an overlapping range of a first position range of the camera in the circumferential direction estimated based on a result of detection by the first acceleration detector and a second position range of the camera in the circumferential direction estimated based on a result of detection by the second acceleration detector.

5. The detection system of claim 1, wherein the two directions orthogonal to each other are a first direction and a second direction, and wherein, in an acceleration plane in which each of a first acceleration in the first direction and a second acceleration in the second direction is set as an axis, the control device further estimates the position range based on at least one of a position of a point in the acceleration plane indicated by the first acceleration in the first direction during a first half of the movement and the second acceleration in the second direction during the first half of the movement, and a position of a point in the acceleration plane indicated by the first acceleration in the first direction during a second half of the movement and the second acceleration in the second direction during the second half of the movement.

6. The detection system of claim 1, further comprising a rotation mechanism configured to rotate the detection substrate.

7. The detection system of claim 6, wherein the control device corrects the position range of the camera to face the structure that is a detection target of the camera by rotating the detection substrate based on an estimated result of the position range.

8. The detection system of claim 6, wherein the control device detects the state of the structure as a detection target of the camera, and wherein the detection of the state of the structure includes:

capturing an image by the camera;

determining whether or not the structure as the detection target is within the captured image;

if the structure is not within the captured image, rotating the detection substrate by a predetermined angle and then capturing the image again by the camera until the structure as the detection target is within the captured image; and if the structure is within the captured image, detecting the state of the structure from the captured image.

9. A method of detecting a state of a structure within a processing space of a substrate processing apparatus, the method comprising:

loading or unloading a detection substrate into and from the processing space, the detection substrate being provided with a camera configured to detect the state of the structure other than the detection substrate and at least one acceleration detector configured to detect an acceleration in each of two directions orthogonal to each other in a substrate surface; and estimating a position range of the camera in a circumferential direction on the detection substrate within the processing space based on a result of detection by the at least one acceleration detector when the detection substrate is moved in a loading/unloading direction during the loading or unloading.

10. The method of claim 9, wherein patterns that are adoptable by a history of acceleration during the movement in the loading/unloading direction are classified in advance, and wherein the estimating the position range determines which one of the patterns corresponds to the history of acceleration detected by the at least one acceleration detector in each of the directions orthogonal to each other, and estimates the position range based on a result of determination.

11. The method of claim 10, wherein the estimating the position range determines which one of the patterns corresponds to the history of acceleration detected by the at least one acceleration detector based on a magnitude relationship between an acceleration during a first half of the movement in the loading/unloading direction and an acceleration during a second half of the movement in the loading/unloading direction.

12. The method of claim 9, wherein the at least one acceleration detector of the detection substrate is provided with a first acceleration detector and a second acceleration detector, wherein the first acceleration detector and the second acceleration detector measure accelerations in different directions, respectively, and wherein the position range is an overlapping range of a first position range of the camera in the circumferential direction estimated based on a result of detection by the first acceleration detector and a second position range of the camera in the circumferential direction estimated based on a result of detection by the second acceleration detector.

13. The method of claim 9, wherein the two directions orthogonal to each other are a first direction and a second direction, and wherein, in an acceleration plane in which each of a first acceleration in the first direction and a second acceleration in the second direction is set as an axis, the position range is estimated based on at least one of a position of a point in the acceleration plane indicated by the first acceleration in the first direction during a first half of the movement and the second acceleration in the second direction during the first half of the movement, and a position of a point in the acceleration plane indicated by the first acceleration in the first direction during a second half of the movement and the second acceleration in the second direction during the second half of the movement.

14. The method of claim 9, further comprising: correcting the position range of the camera to face the structure that is a detection target of the camera by rotating the detection substrate based on an estimated result of the position range.

15. The method of claim 9, further comprising: detecting the state of the structure as a detection target of the camera, wherein the detecting the state of the structure includes:

capturing an image by the camera;

determining whether or not the structure as the detection target is within the captured image; and if the structure is not within the captured image, rotating 5 the detection substrate by a predetermined angle and then capturing the image again by the camera until the structure as the detection target is within the captured image.

16. A non-transitory computer-readable storage medium 10 storing a program that operates on a computer of a control device configured to control the method of claim 9 and causes a detection system to execute the method.

\* \* \* \* \*